(12) United States Patent
Chen et al.

(10) Patent No.: US 11,810,934 B2
(45) Date of Patent: Nov. 7, 2023

(54) IMAGE SENSORS INCLUDING INSULATING LAYERS IN DIFFERENT PIXEL REGIONS HAVING DIFFERENT THICKNESSES AND METHODS FOR FORMING THE SAME

(71) Applicant: VisEra Technologies Company Limited, Hsin-Chu (TW)

(72) Inventors: Yu-Jen Chen, Taoyuan (TW); Chang-Wei Chen, Kaohsiung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 333 days.

(21) Appl. No.: 15/944,102

(22) Filed: Apr. 3, 2018

(65) Prior Publication Data
US 2019/0305019 A1 Oct. 3, 2019

(51) Int. Cl.
*H01L 27/146* (2006.01)
*H01L 23/532* (2006.01)

(52) U.S. Cl.
CPC .. *H01L 27/14625* (2013.01); *H01L 23/53209* (2013.01); *H01L 27/14605* (2013.01);
(Continued)

(58) Field of Classification Search
CPC ......... H01L 27/14605; H01L 27/14643; H01L 27/14683; H01L 27/14621;
(Continued)

(56) References Cited

U.S. PATENT DOCUMENTS 9,476,853 B2 * 10/2016 Li ..................... B01L 3/502707
2006/0205107 A1 * 9/2006 Inaba ................ H01L 27/14627
438/57
(Continued)

FOREIGN PATENT DOCUMENTS

CN 101495889 A 6/2009
JP 2009-545150 12/2009
(Continued)

OTHER PUBLICATIONS

Office Action of corresponding JP Application No. 2018-193436 dated Mar. 31, 2020.
(Continued)

*Primary Examiner* — Jennifer D Bennett
(74) *Attorney, Agent, or Firm* — MUNCY, GEISSLER, OLDS & LOWE, P.C.

(57) ABSTRACT

An image sensor is provided. The image sensor includes a substrate having a first pixel region and a second pixel region. The image sensor also includes a resonator structure disposed over the substrate. The resonator structure includes a first metal layer over the first pixel region and the second pixel region. The resonator structure also includes a first insulating layer over the first metal layer and the first pixel region. The first insulating layer has a first thickness. The resonator structure further includes a second insulating layer over the first metal layer and the second pixel region. The second insulating layer has a second thickness that is greater than the first thickness. In addition, the resonator structure includes a second metal layer over the first insulating layer and the second insulating layer.

17 Claims, 13 Drawing Sheets

(52) U.S. Cl.
CPC .. *H01L 27/14629* (2013.01); *H01L 27/14643* (2013.01); *H01L 27/14683* (2013.01)

(58) Field of Classification Search
CPC ........... H01L 27/14685; H01L 27/1462; H01L 27/14629; H01L 27/14625; H01L 23/53209
See application file for complete search history.

(56) References Cited

U.S. PATENT DOCUMENTS

| | | | | |
|---|---|---|---|---|
| 2007/0285539 | A1* | 12/2007 | Shimizu | H01L 27/14621 348/272 |
| 2008/0055733 | A1* | 3/2008 | Lim | G02B 5/201 359/619 |
| 2009/0302407 | A1 | 12/2009 | Gidon et al. | |
| 2012/0085944 | A1* | 4/2012 | Gidon | G02B 5/201 250/553 |
| 2013/0032915 | A1* | 2/2013 | Tonotani | H01L 27/1464 257/432 |
| 2015/0206912 | A1 | 7/2015 | Kanamori et al. | |

FOREIGN PATENT DOCUMENTS

| | | |
|---|---|---|
| JP | 2011-254025 | 12/2011 |
| JP | 2015-121417 | 7/2015 |
| JP | 2019-145563 | 8/2019 |
| WO | WO-2008/012235 | 1/2008 |
| WO | WO2015/015722 | 2/2015 |
| WO | WO2019159710 A1 | 8/2019 |

OTHER PUBLICATIONS

Office Action issued in corresponding CN application No. 201811086495.9 dated Jan. 27, 2021.

* cited by examiner

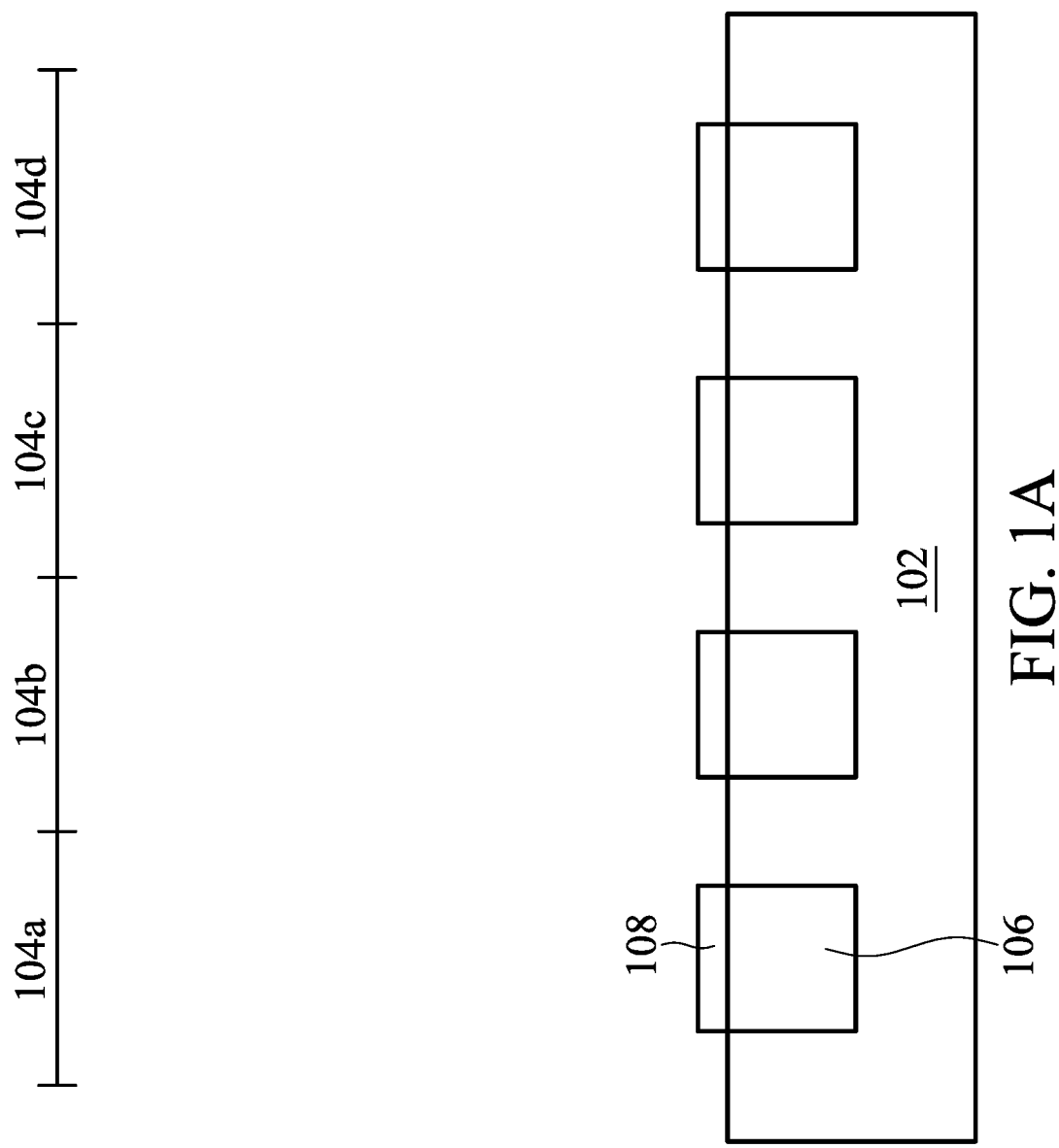

IMAGE SENSORS INCLUDING INSULATING LAYERS IN DIFFERENT PIXEL REGIONS HAVING DIFFERENT THICKNESSES AND METHODS FOR FORMING THE SAME

BACKGROUND

Field of the Invention

The invention relates to an image sensor and more particularly to an image sensor including a resonator structure.

Description of the Related Art

As digital technology develops, image sensors are becoming more widely used in society. For example, image sensors have been applied to modern information and communication devices such as televisions, notebooks, computers, mobile phones and smartphones. In addition, each generation of image sensors has been developed to be thinner, lighter, smaller, and more fashionable than the last.

Although image sensors have been generally adequate for their intended purposes, they have not been entirely satisfactory in all respects. Consequently, it is desirable to provide a solution for improving image sensors.

BRIEF SUMMARY

According to some embodiments, an image sensor is provided. The image sensor includes a substrate having a first pixel region and a second pixel region. The image sensor also includes a resonator structure disposed over the substrate. The resonator structure includes a first metal layer over the first pixel region and the second pixel region. The resonator structure also includes a first insulating layer over the first metal layer and the first pixel region. The first insulating layer has a first thickness. The resonator structure further includes a second insulating layer over the first metal layer and the second pixel region. The second insulating layer has a second thickness that is greater than the first thickness. In addition, the resonator structure includes a second metal layer over the first insulating layer and the second insulating layer.

According to some embodiments, a method for forming an image sensor is provided. The method includes providing a substrate having a first pixel region and a second pixel region. The method also includes forming a resonator structure over the substrate. The formation of the resonator structure includes forming a first metal layer over the first pixel region and the second region of the substrate. The formation of the resonator structure also includes forming a first insulating layer over the first metal layer, and over the first pixel region of the substrate. The first insulating layer has a first thickness. The formation of the resonator structure also includes forming a second insulating layer over the first metal layer, and over the second pixel region. The second insulating layer has a second thickness that is greater than the first thickness. In addition, the formation of the resonator structure includes forming a second metal layer over the first insulating layer and the second insulating layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 1A-1F are cross-sectional views of various stages of a process for forming an image sensor, in accordance with some embodiments.

DETAILED DESCRIPTION

Figure 1B:
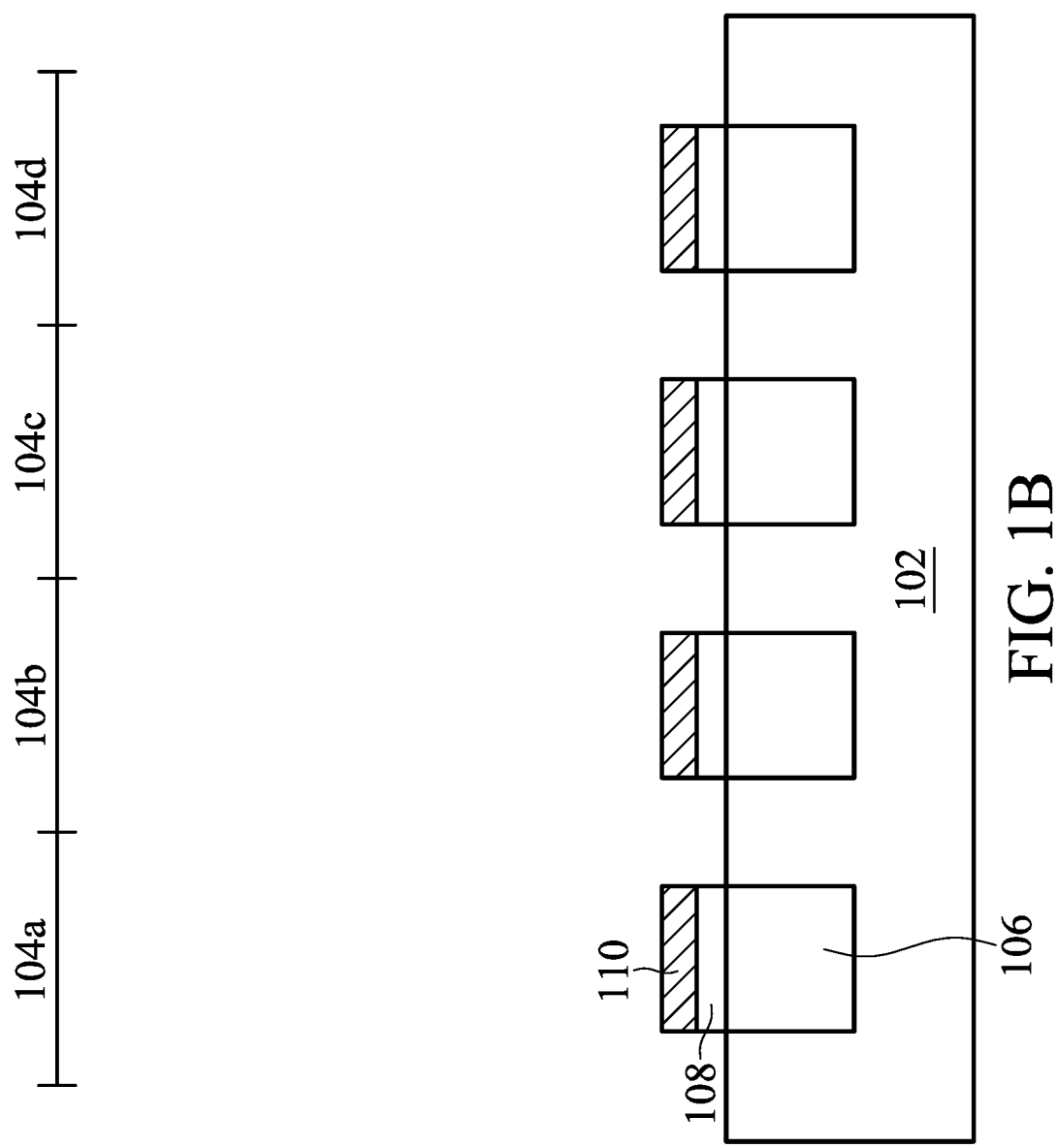

The filter collimator of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Referring to FIGS. 1A-1F, FIGS. 1A-1F are cross-sectional views of various stages of a process for forming an image sensor 100, in accordance with some embodiments. As shown in FIG. 1A, the image sensor includes a substrate 102. The substrate 102 may include, but is not limited to, a semiconductor substrate such as a silicon substrate. In addition, the substrate 102 may include an element semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 102 may include a semiconductor-on-insulator (SOI).

In some embodiments, as shown in FIG. 1A, the substrate 102 includes a first pixel region 104a, a second pixel region 104b, a third pixel region 104c and a fourth pixel region 104d. In some embodiments, each of the first pixel region 104a, the second pixel region 104b, the third pixel region 104c and the fourth pixel region 104d may receive different wavelength of light.

In some embodiments, as shown in FIG. 1A, the substrate 102 includes photodiodes 106 that are corresponding to each of the first pixel region 104a, the second pixel region 104b, the third pixel region 104c and the fourth pixel region 104d. The photodiode 106 may include a p-n junction structure or a PIN (p-type, intrinsic and n-type) structure. The current is generated when photons are absorbed in the photodiode 106, and a light signal is converted into a current signal.

In addition, the wiring layer (not shown) is disposed between two neighboring photodiodes 106. The wiring layer is made of conductive material. The conductive material includes copper, aluminum, molybdenum, tungsten, gold, chromium, nickel, platinum, titanium, iridium, rhodium, the above alloys, another applicable metal conductive material, or a combination thereof. The wiring layer is configured to absorb light which does not hit the photodiodes 106.

It should be noted that the substrate 102 shown in FIG. 1A is merely an example for better understanding the concept of the disclosure, and the scope of the disclosure is not intended to be limiting. That is, besides the photodiodes 106, the substrate 102 may include more semiconductor elements in various embodiments.

In some embodiments, as shown in FIG. 1A, the image sensor also includes protective layers 108 that are corresponding to each of the first pixel region 104a, the second pixel region 104b, the third pixel region 104c and the fourth pixel region 104d. The protective layers 108 may be used to protect subsequently formed waveguide or resonator structure. In some embodiments, the protective layers 108 include dielectric materials. For example, the material of the protective layer 108 may include silicon dioxide, hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof.

The selection of the material for the protective layers 108 may depend on the material of the subsequently formed metal layer. In some embodiments, the protective layer 108 is made of $SiO_2$, $Al_2O_3$ or other suitable materials.

Subsequently, as shown in FIG. 1B, metal layers 110 are formed over each of the protective layers 108 respectively, in accordance with some embodiments. The metal layers 110 may be used as a bottom metal layer of subsequently formed waveguide or resonator structure. In some embodiments, the metal layers 110 includes Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, alloys, or a combination thereof.

The selection of the material of the metal layers 110 may depend on wavelength of light that can pass through subsequently formed waveguide or resonator structure. In some embodiments, the metal layer 110 is made of Cu, Al, Ag or an alloy mentioned above. In some embodiments, the thickness of the metal layer 110 is in a range of about 10 nm to about 10 μm. As shown in FIG. 1B, the thickness of the metal layers 110 on the first pixel region 104a, the second pixel region 104b, the third pixel region 104c and the fourth pixel region 104d are the same. Many variations and/or modifications can be made to embodiments of the disclosure. In some embodiments, the thicknesses of the metal layers 110 on the first pixel region 104a, the second pixel region 104b, the third pixel region 104c and the fourth pixel region 104d are different from each other.

Figure 1C:
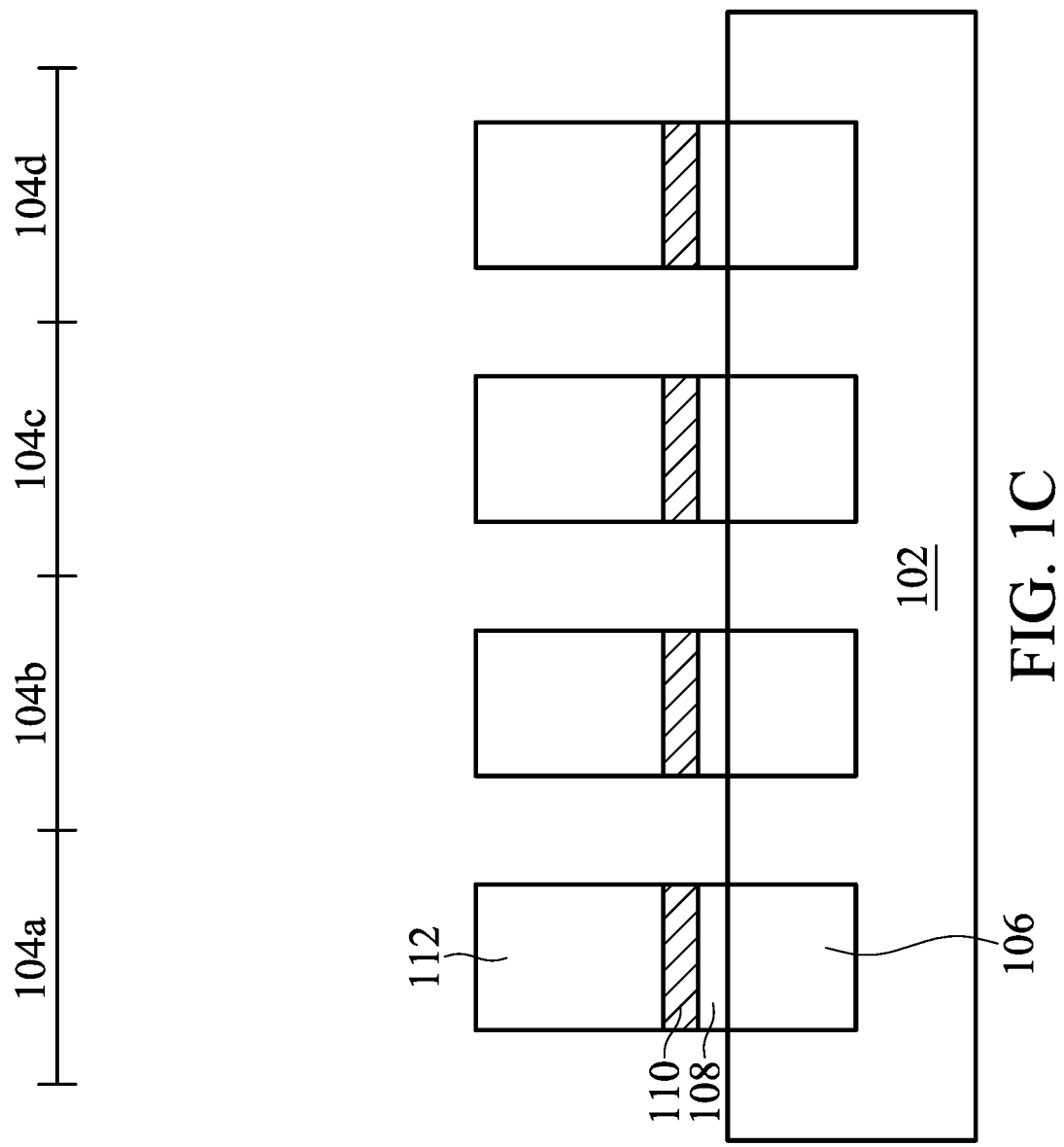

Subsequently, as shown in FIG. 1C, insulating layers 112 are formed over each of the metal layers 110 respectively, in accordance with some embodiments. The insulating layer 112 is used as a resonance cavity of subsequently formed waveguide or resonator structure.

In some embodiments, the insulating layer 112 includes a photosensitive material. The photosensitive material includes photo-initiator selected from the group consisting of diethoxy acetophenone, benzophenone, benzyl benzoin isobutyl ether, benzyl dimethyl ketal, aromatic diazonium salts, triallysulfonium salts, diallyiodonium salts, metallocene compounds and mixtures thereof. The photosensitive material also include photosensitive polymerizable monomers or oligomers selected from the groups consisting of double-bond compounds, compounds having epoxy functional group and mixtures thereof; and modifier selected from the groups consisting of long-alkyl-chain functional group, silicone-alkyl compounds, double-bond compounds and mixtures thereof. The thickness of the insulating layer 112 is determined from thickness of subsequently formed insulating layers 112a-112d which allow different wavelength of light to pass through. For example, the thickness of the insulating layer 112 is in a range of about 1 µm to about 20 µm.

Figure 1D:
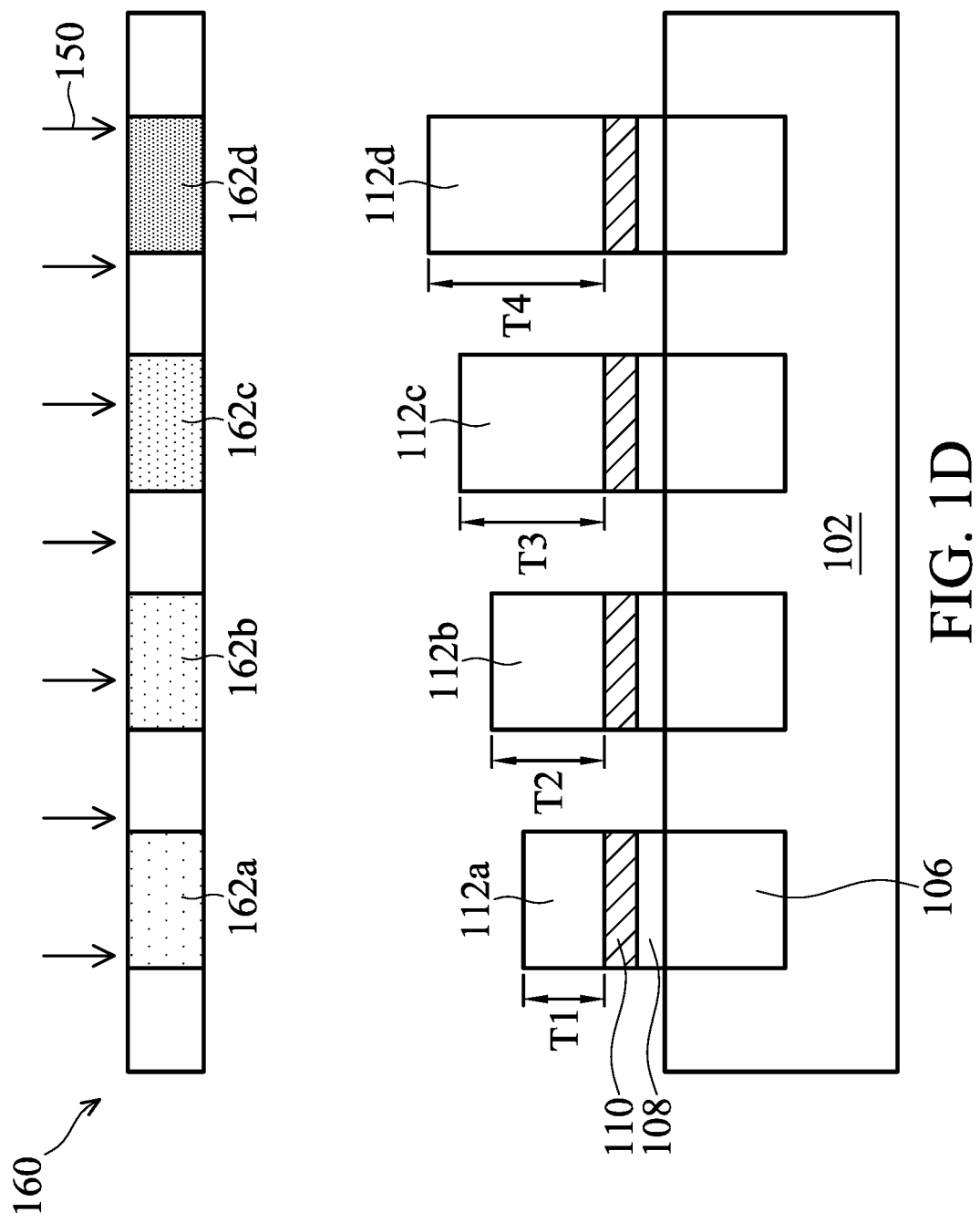

Subsequently, as shown in FIG. 1D, portions of the insulating layers 112 are removed so that the insulating layer 112a over the first pixel region 104a, the insulating layer 112b over the second pixel region 104b, the insulating layer 112c over the third pixel region 104c and the insulating layer 112d over the fourth pixel region 104d are formed. In some embodiments, as shown in FIG. 1D, the insulating layers 112a, 112b, 112c and 112d have different thicknesses.

In some embodiments, the insulating layers 112a, 112b, 112c and 112d are made of a positive photoresist. The positive photoresist material decomposes after exposure to the light. The material of the positive photoresist includes phenol-formaldehyde resin, epoxy resin or other suitable materials.

In some embodiments, the insulating layers 112a, 112b, 112c and 112d are formed by a lithography process. In some embodiments, a multi-tone mask 160 is used to assist removal of the insulating layer 112 to form the insulating layers 112a, 112b, 112c and 112d. As shown in FIG. 1D, the multi-tone mask 160 includes a light transmission region 162a, a light transmission region 162b, a light transmission region 162c and a light transmission region 162d corresponding to the first pixel region 104a, the second pixel region 104b, the third pixel region 104c and the fourth pixel region 104d, respectively. The light transmission regions 162a, 162b, 162c and 162d may be filled with materials with different density so that the light transmission regions 162a, 162b, 162c and 162d have a different light transmittance. As a result, when light 150 passes through the multi-tone mask 160, different amount of the light passes through the light transmission regions 162a, 162b, 162c and 162d. In this embodiment, as shown in FIG. 1D, the density of filled material in the light transmission region 162d is greater than that in the light transmission region 162c, the density of filled material in the light transmission region 162c is greater than that in the light transmission region 162b and the density of filled material in the light transmission region 162b is greater than that in the light transmission region 162a. As a result, the light transmittance of the light transmission region 162d is smaller than that of the light transmission region 162c, the light transmittance of the light transmission region 162c is smaller than that of the light transmission region 162b and the light transmittance of the light transmission region 162b is smaller than that of the light transmission region 162a.

The thicknesses of the insulating layers 112a, 112b, 112c and 112d depend on the light transmittance of the light transmission regions 162a, 162b, 162c and 162d, respectively. In some embodiments, after the exposure of the light 150 with the multi-tone mask 160 and a development process performed on the insulating layers 112, the insulating layer 112a over the first pixel region 104a has a thickness T1, the insulating layer 112b over the second pixel region 104b has a thickness T2 greater than the thickness T1, the insulating layer 112c over the third pixel region 104c has a thickness T3 greater than the thickness T2 and the insulating layer 112d over the fourth pixel region 104d has a thickness T4 greater than the thickness T3. In some embodiments, the thicknesses of the insulating layers 112a, 112b, 112c and 112d are in a range of about 100 nm to about 10 µm.

Figure 1E:
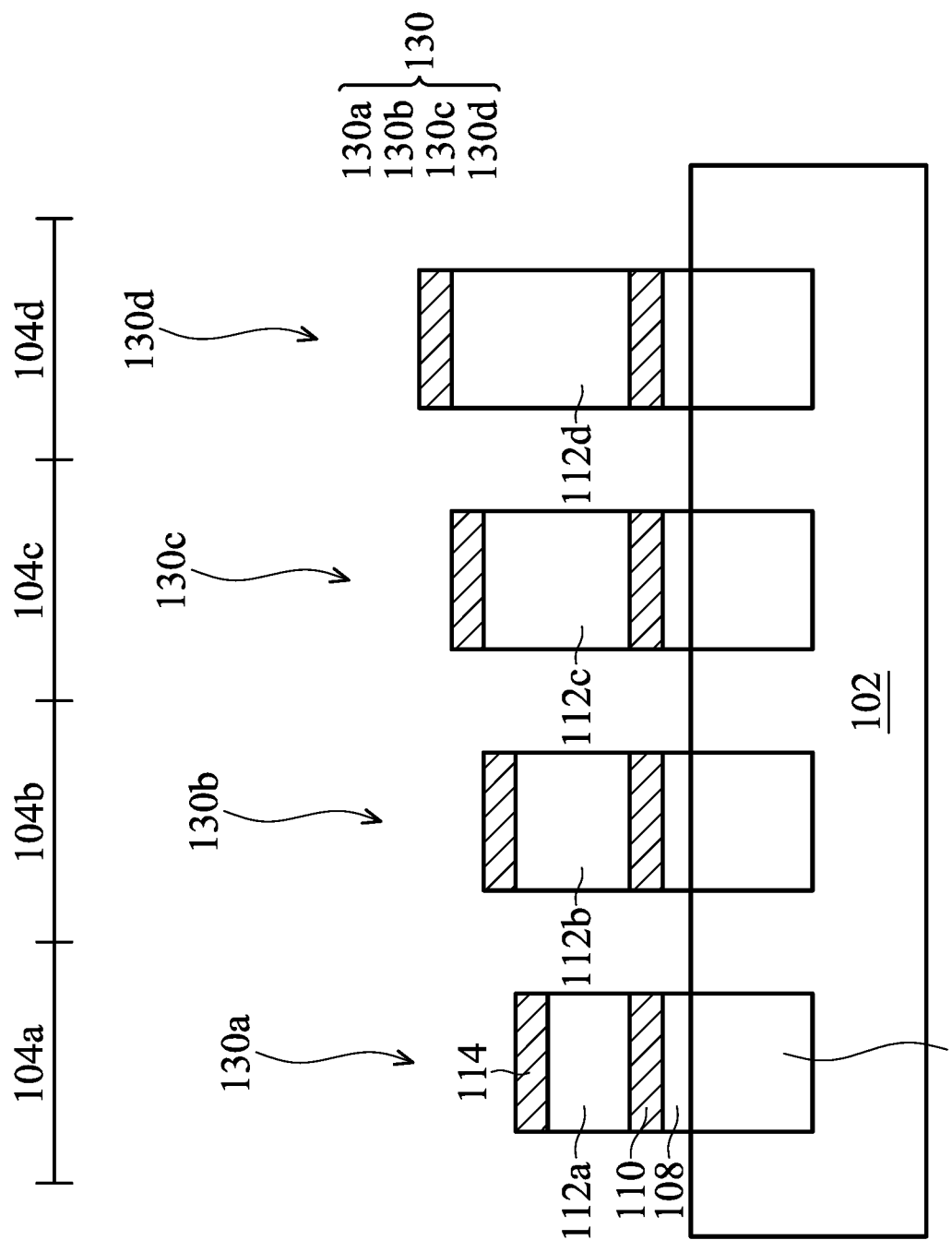

Next, as shown in FIG. 1E, metal layers 114 are formed over the insulating layers 112a, 112b, 112c and 112d respectively, in accordance with some embodiments. After the metal layers 114 are formed, a waveguide 130a, a waveguide 130b, a waveguide 130c and a waveguide 130d are formed. As a result, a resonator structure 130 including the waveguides 130a, 130b, 130c and 130d is created. The metal layers 114 may be used as a top metal layer of the waveguides 130a, 130b, 130c and 130d of the resonator structure 130. In some embodiments, the metal layers 114 includes Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, alloys, or a combination thereof.

The selection of the material of the metal layers 114 may depend on wavelength of light that can pass through the waveguides 130a, 130b, 130c and 130d. In some embodiments, the metal layer 114 is made of Cu, Al, Ag or an alloy mentioned above. In some embodiments, the thickness of the metal layers 114 is in a range of about 10 nm to about 10 µm. As shown in FIG. 1E, the thicknesses of the metal layers 114 on the first pixel region 104a, the second pixel region 104b, the third pixel region 104c and the fourth pixel region 104d are the same. Many variations and/or modifications can be made to embodiments of the disclosure. In some embodiments, the thicknesses of the metal layers 114 on the first pixel region 104a, the second pixel region 104b, the third pixel region 104c and the fourth pixel region 104d are different from each other.

In some embodiments, as shown in FIG. 1E, the thickness of the metal layers 114 is the same as that of the metal layers 110. Many variations and/or modifications can be made to embodiments of the disclosure. In some embodiments, the thickness of the metal layers 114 is different from that of the metal layers 110.

As shown in FIG. 1E, the resonator structure 130 includes the waveguides 130a, 130b, 130c and 130d that are corresponding to the first pixel region 104a, the second pixel region 104b, the third pixel region 104c and the fourth pixel region 104d, respectively. Each of the waveguides 130a, 130b, 130c and 130d includes a bottom metal layer (e.g. the metal layers 110), an insulating layer (e.g. the insulating layers 112a, 112b, 112c and 112d) and a top metal layer (e.g. the metal layers 114) as a MIM structure. As shown in FIG. 1E, the insulating layer is sandwiched between the bottom metal layer and the top metal layer. In addition, each of the waveguides 130a, 130b, 130c and 130d also include at least two opening (not shown) cable of transmitting the light. The resonance wavelength of light coupling with the waveguide has greater transmittance than off-resonance wavelength. Namely, the waveguides 130a, 130b, 130c and 130d allow specific wavelength of light to pass through, respectively.

The wavelength of the light that passes through the resonator structure 130 depends on the thickness of the insulating layer sandwiched between the bottom metal layer and the top metal layer. In some embodiments, as shown in FIG. 1E, the thickness of the insulating layers 112a, 112b, 112c and 112d influence the wavelength of the light that passes through the waveguides 130a, 130b, 130c and 130d, respectively. Since the insulating layers 112a, 112b, 112c and 112d have different thicknesses respectively, the photodiodes 106 of the first pixel region 104a, the second pixel region 104b, the third pixel region 104c and the fourth pixel region 104d receive different wavelength of light.

Figure 1F:
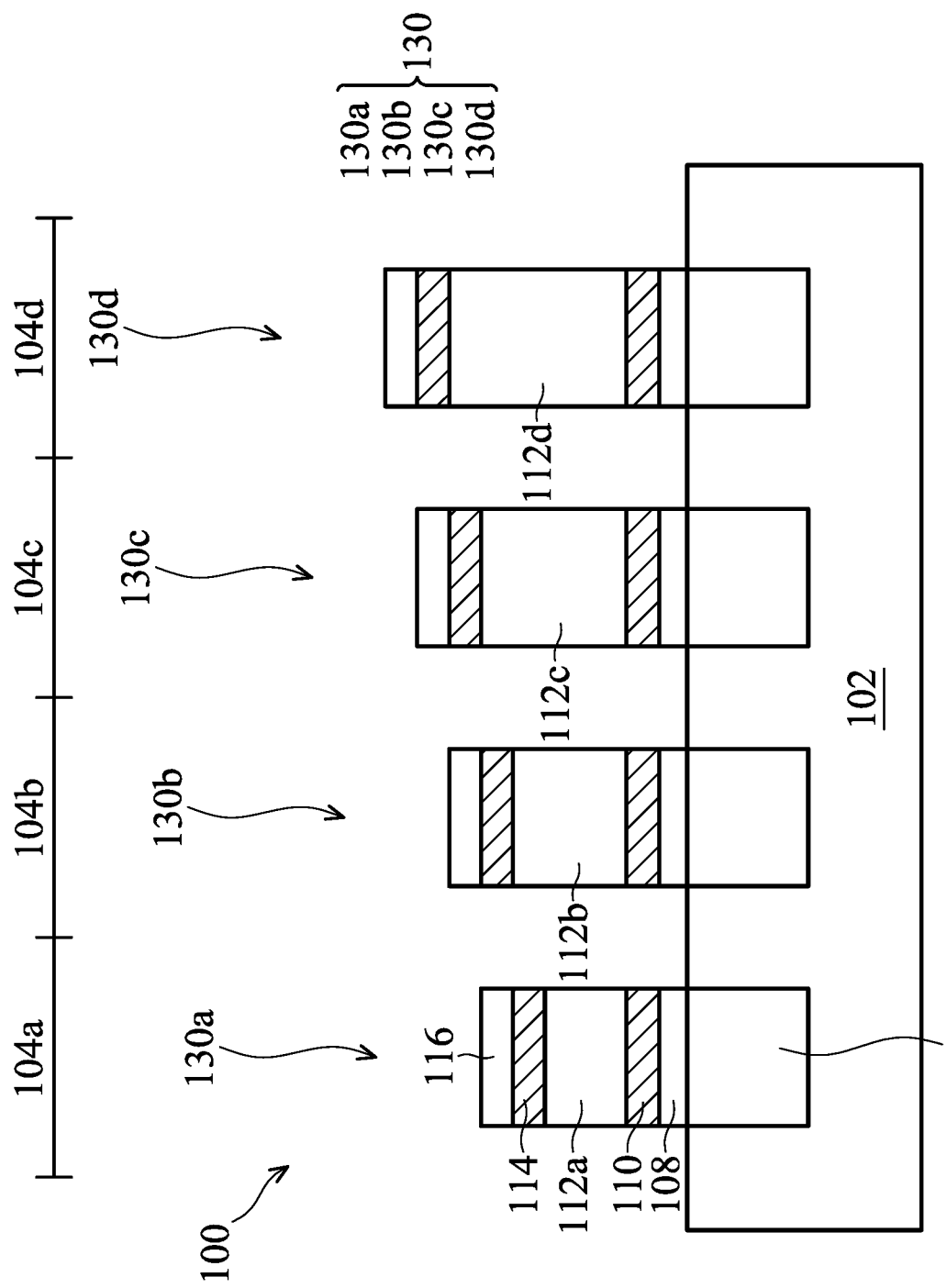

Subsequently, as shown in FIG. 1F, protective layers 116 are formed over each of the metal layers 114 respectively, in accordance with some embodiments. The protective layers 116 may be used to protect the resonator structure 130. The selection of the material of the protective layer 116 may depend on the material of the metal layers 114. In some embodiments, the material of the protective layer 116 is the same as or similar to that of the protective layers 108.

After the protective layers 116 are formed, the image sensor 100 is created. As mentioned above, the waveguides 130a, 130b, 130c and 130d allow different wavelength of the light to pass through. Therefore, the waveguides 130a, 130b, 130c and 130d can be used as a color filter. Moreover, the resonator structure 130 can be used as an optical emission spectrometer of the image sensor 100. In addition, in the step of the removal of the insulating layer 112, the insulating layers 112a, 112b, 112c and 112d with different thickness can be formed in one step by using the multi-tone mask 160 during the exposure of the light 150. As a result, the process of manufacturing the image sensor 100 is simplified and the cost is reduced.

Figure 2A:
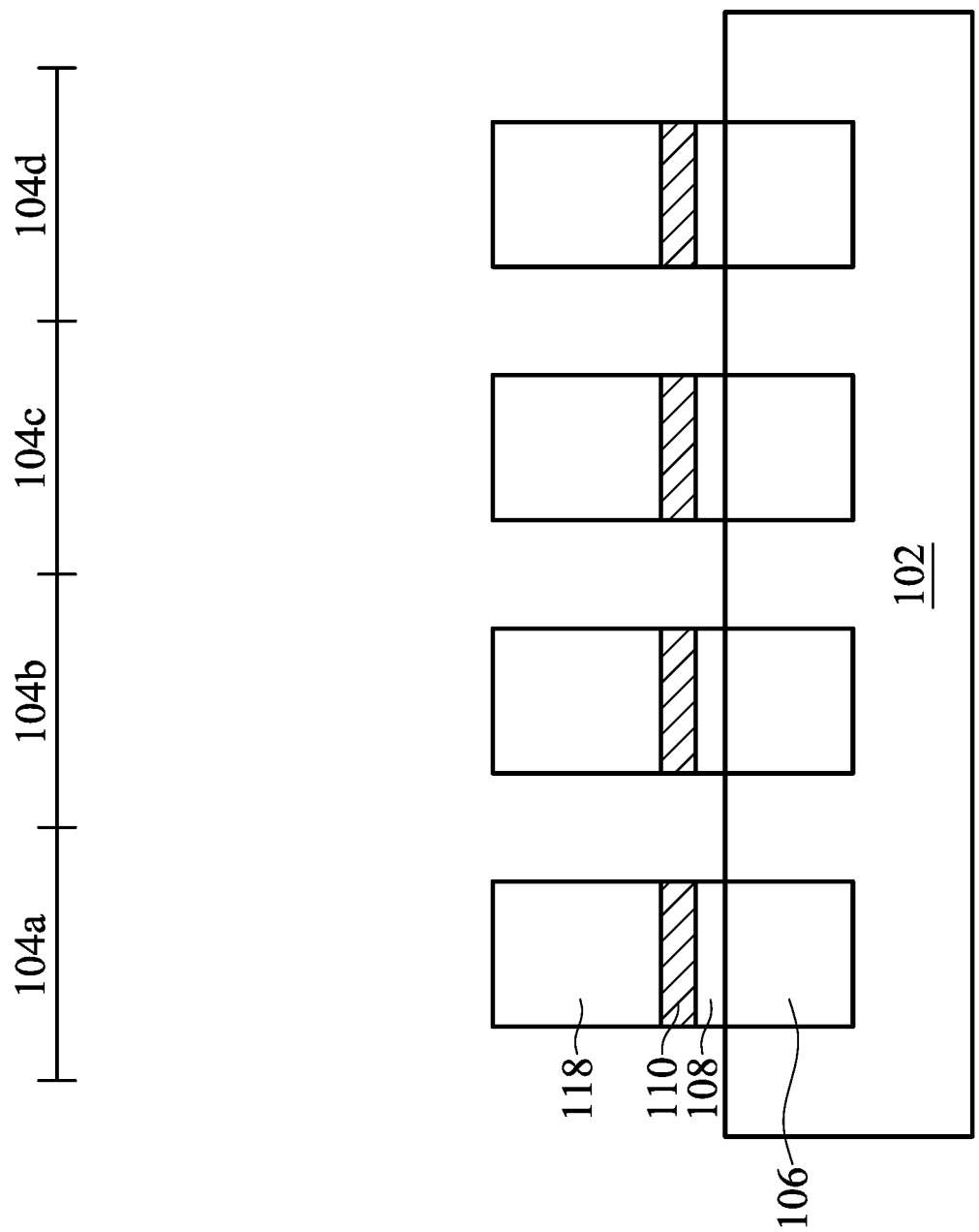
FIGS. 2A-2E are cross-sectional views of various stages of a process for forming an image sensor, in accordance with some embodiments.

Referring to FIGS. 2A-2E, FIGS. 2A-2E are cross-sectional views of various stages of a process for forming an image sensor 200. Referring to FIG. 2A is a cross-sectional view after performing the stage of the process shown in FIG. 1B, in accordance with some embodiments.

As shown in FIG. 2A, spacer layers 118 are formed over each of the metal layers 110, and over the first pixel region 104a, the second pixel region 104b, the third pixel region 104c and the fourth pixel region 104d respectively, in accordance with some embodiments. The spacer layer 118 is used as an insulating layer of subsequently formed waveguide or resonator structure. In some embodiments, the spacer layer 118 includes a low refractive index material. For example, the spacer layer 118 may be a dielectric material. The dielectric material includes phosphosilicate glass (PSG), borophosphosilicate glass (BPSG), low dielectric constant (low-k) dielectric material and other applicable dielectric materials. The low dielectric constant dielectric materials include, but are not limited to, fluorinated silica glass (FSG), carbon doped silicon oxide, amorphous fluorinated carbon, parylene, bis-benzocyclobutenes (BCB), polyimides, combinations of the above-mentioned materials, and other applicable materials. The thickness of the spacer layer 118 is determined from thickness of subsequently formed insulating layer 118a-118d which allow different wavelength of light to pass through. For example, the thickness of the spacer layer 118 is in a range of about 1 μm to about 20 μm.

Figure 2B:
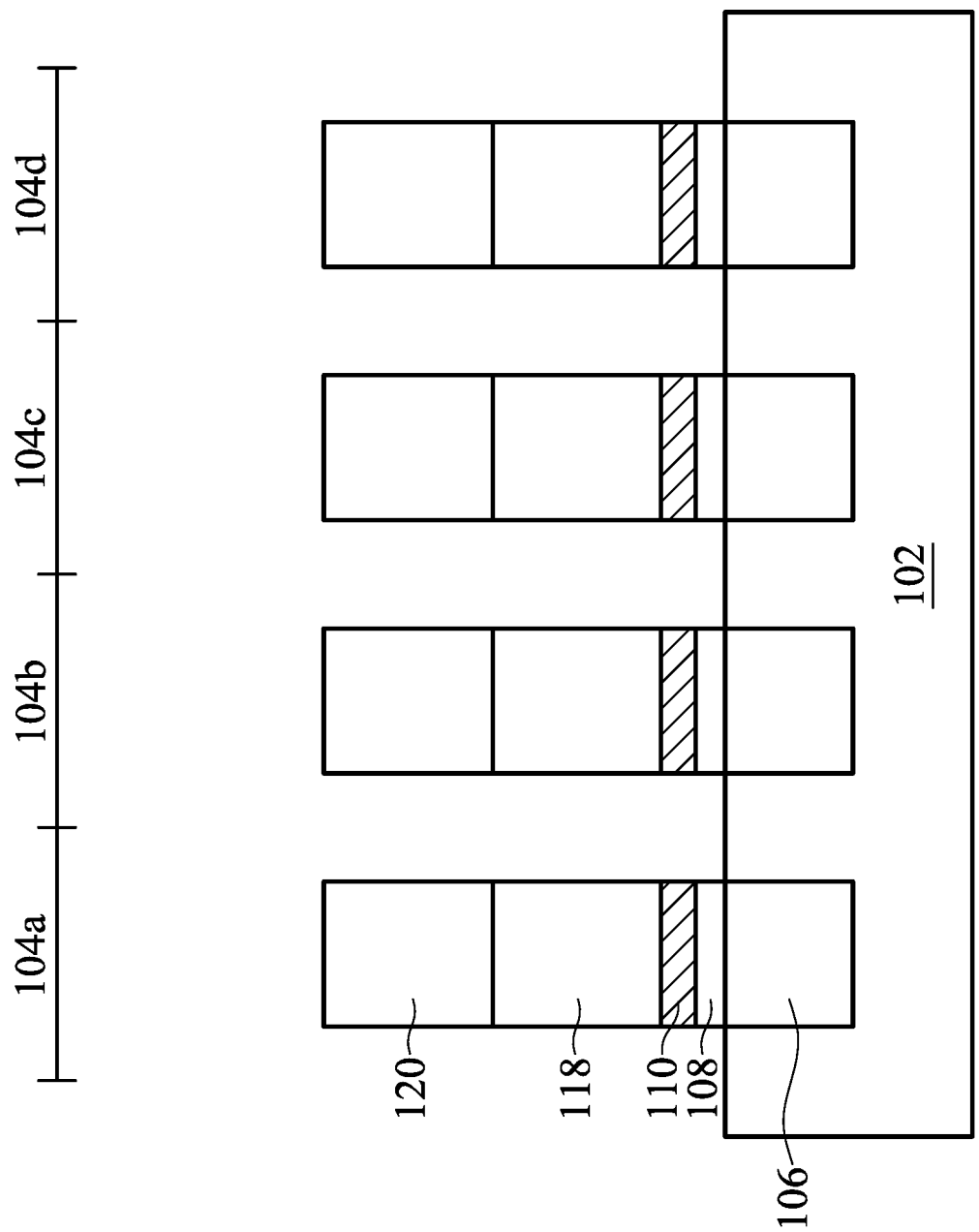

Subsequently, as shown in FIG. 2B, photosensitive material layers 120 are formed over each of the spacer layers 118 respectively, in accordance with some embodiments. In some embodiments, the photosensitive material layers 120 are used as etching buffer layers which assist removal of the spacer layer 118 in subsequently processes. In some embodiments, the photosensitive material layer 120 is a positive photoresist which decomposes after exposure to the light.

Figure 2C:
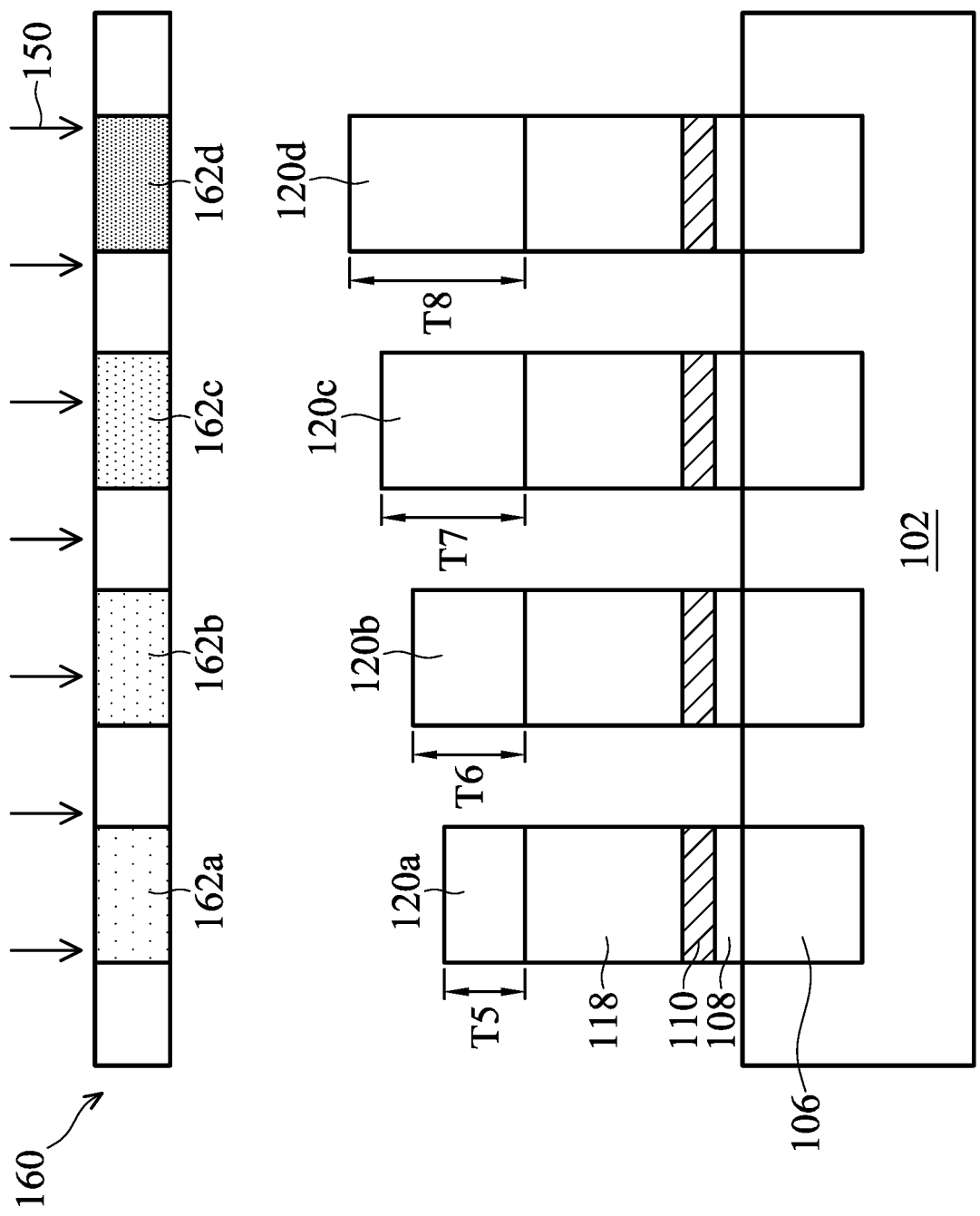

Subsequently, as shown in FIG. 2C, portions of the photosensitive material layers 120 are exposure to the light 150 by using the multi-tone mask 160 and a development process performed on the photosensitive material layers 120, and an etching buffer layer 120a, an etching buffer layer 120b, an etching buffer layer 120c and an etching buffer layer 120d are formed. As shown in FIG. 2C, during the exposure process, the multi-tone mask 160 is used so that the etching buffer layer 120a over the first pixel region 104a, the etching buffer layer 120b over the second pixel region 104b, the etching buffer layer 120c over the third pixel region 104c and the etching buffer layer 120d over the fourth pixel region 104d have different thicknesses. The removal process shown in FIG. 2C is the same as or similar to the process shown in FIG. 1D, and the details thereof are not repeated herein.

The thickness of the etching buffer layers 120a, 120b, 120c and 120d depend on the light transmittance of the light transmission regions 162a, 162b, 162c and 162d, respectively. In some embodiments, as shown in FIG. 2C, the etching buffer layer 120a over the first pixel region 104a has a thickness T5, the etching buffer layer 120b over the second pixel region 104b has a thickness T6 greater than the thickness T5, the etching buffer layer 120c over the third pixel region 104c has a thickness T7 greater than the thickness T6 and the etching buffer layer 120d over the fourth pixel region 104d has a thickness T8 greater than the thickness T7.

Figure 2D:
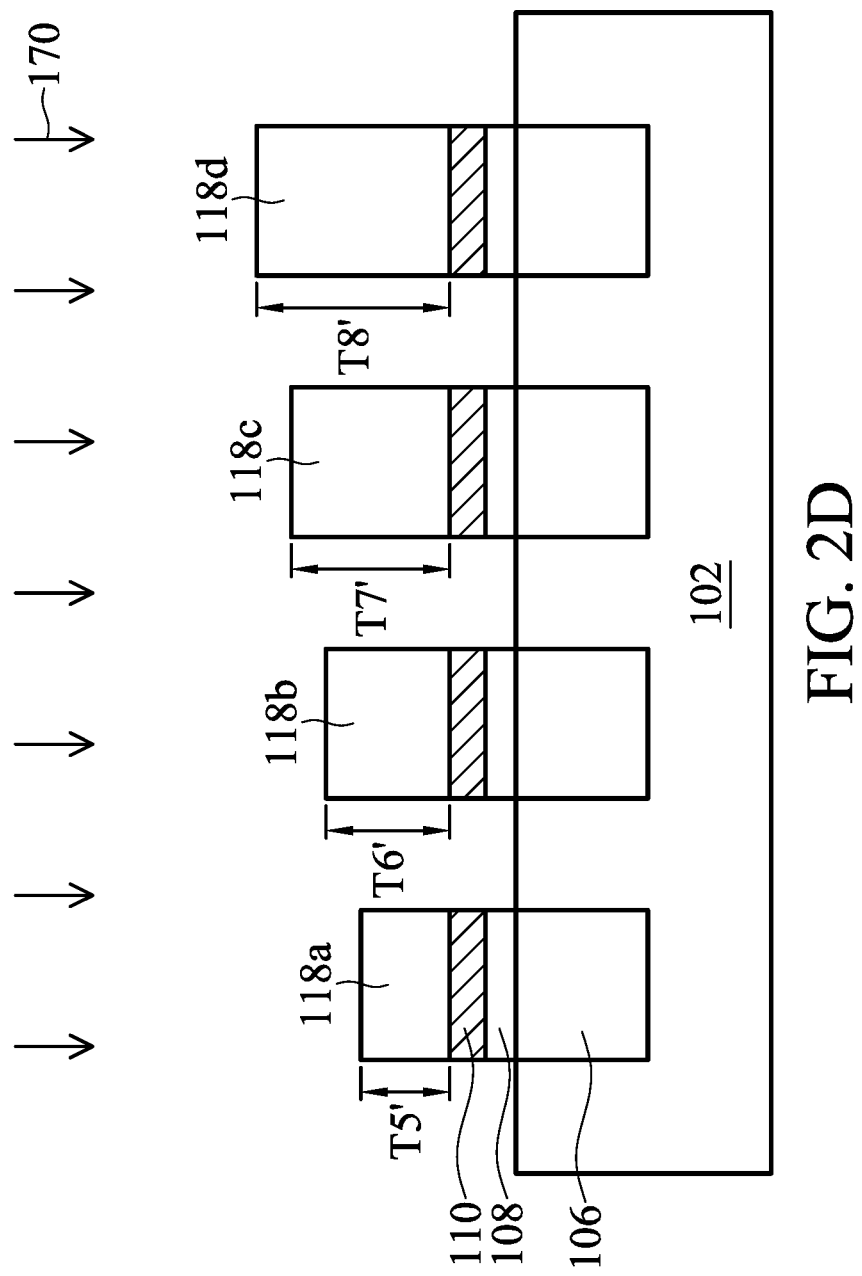

Subsequently, as shown in FIG. 2D, portions of the spacer layers 118 are removed by an etching process 170 so that an insulating layer 118a, an insulating layer 118b, an insulating layer 118c and an insulating layer 118d are formed, in accordance with some embodiments. In addition, the etching buffer layers 120a, 120b, 120c and 120d are removed completely during the etching process 170. The etching process 170 may include a dry etching process. The dry etching process includes a plasma etching process or another applicable etching process. In some embodiments, the etchant used in the etching process contains carbon, chlorine and fluorine. For example, the etchant used in the etching process may include chlorine ($Cl_2$), tetrafluoromethane ($CF_4$), fluoromethane ($CH_3F$), hexa-fluoro-butadiene ($C_4F_6$), or another suitable etching gas.

In some embodiments, the etching buffer layers 120a, 120b, 120c and 120d are used to control the thicknesses of the insulating layers 118a, 118b, 118c and 118d, respectively. In some embodiments, the thicknesses of the insulating layers 118a, 118b, 118c and 118d depend on those of the etching buffer layers 120a, 120b, 120c and 120d, respectively. As shown in FIG. 2D, the insulating layer 118a over the first pixel region 104a has a thickness T5', the insulating layer 118b over the second pixel region 104b has a thickness T6' greater than the thickness T5', the insulating layer 118c over the third pixel region 104c has a thickness T7' greater than the thickness T6' and the insulating layer 118d over the fourth pixel region 104d has a thickness T8' greater than the thickness T7'. In this embodiment, the relation of the thicknesses between the insulating layers 118a, 118b, 118c and 118d are the same as those between the etching buffer layers 120a, 120b, 120c and 120d.

Figure 2E:
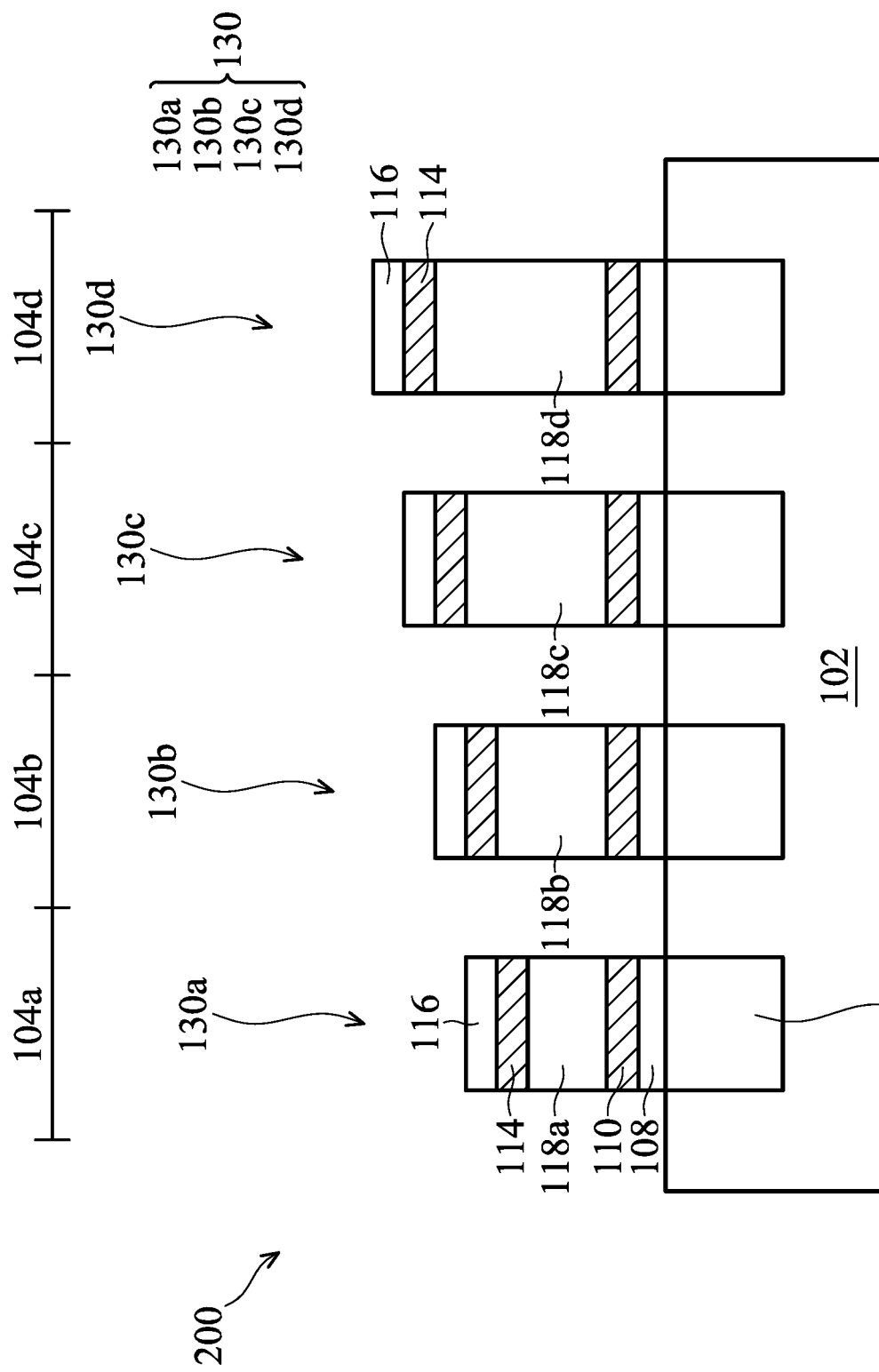

Subsequently, as shown in FIG. 2E, the metal layers 114, the protective layers 116 are formed on the insulating layers 118a, 118b, 118c and 118d respectively, so that the waveguides 130a, 130b, 130c and 130d which construct the resonator structure 130 are formed, and an image sensor 200 is created in accordance with some embodiments. The processes from the structure shown in FIG. 2D to the structure shown in FIG. 2E may be similar to the processes from the structure shown in FIG. 1E to the structure shown in FIG. 1F, and the details thereof are not repeated herein.

As shown in FIG. 2E, the waveguides 130a, 130b, 130c and 130d include a bottom metal layer (e.g. metal layers 110), an insulating layer (e.g. the insulating layers 118a, 118b, 118c and 118d) and a top metal layer (e.g. metal layers 114). As mentioned above, the waveguides 130a, 130b, 130c and 130d allow different wavelength of light to pass through. Therefore, the waveguides 130a, 130b, 130c and 130d can be used as a color filter. Moreover, the resonator structure 130 can be used as an optical emission spectrometer of the image sensor 200. In this embodiment, the photosensitive layer to form the etching buffer layer is used to control the thickness of the insulating layer so that the insulating layer can be selected from dielectric materials other than positive photosensitive material.

Figure 3:
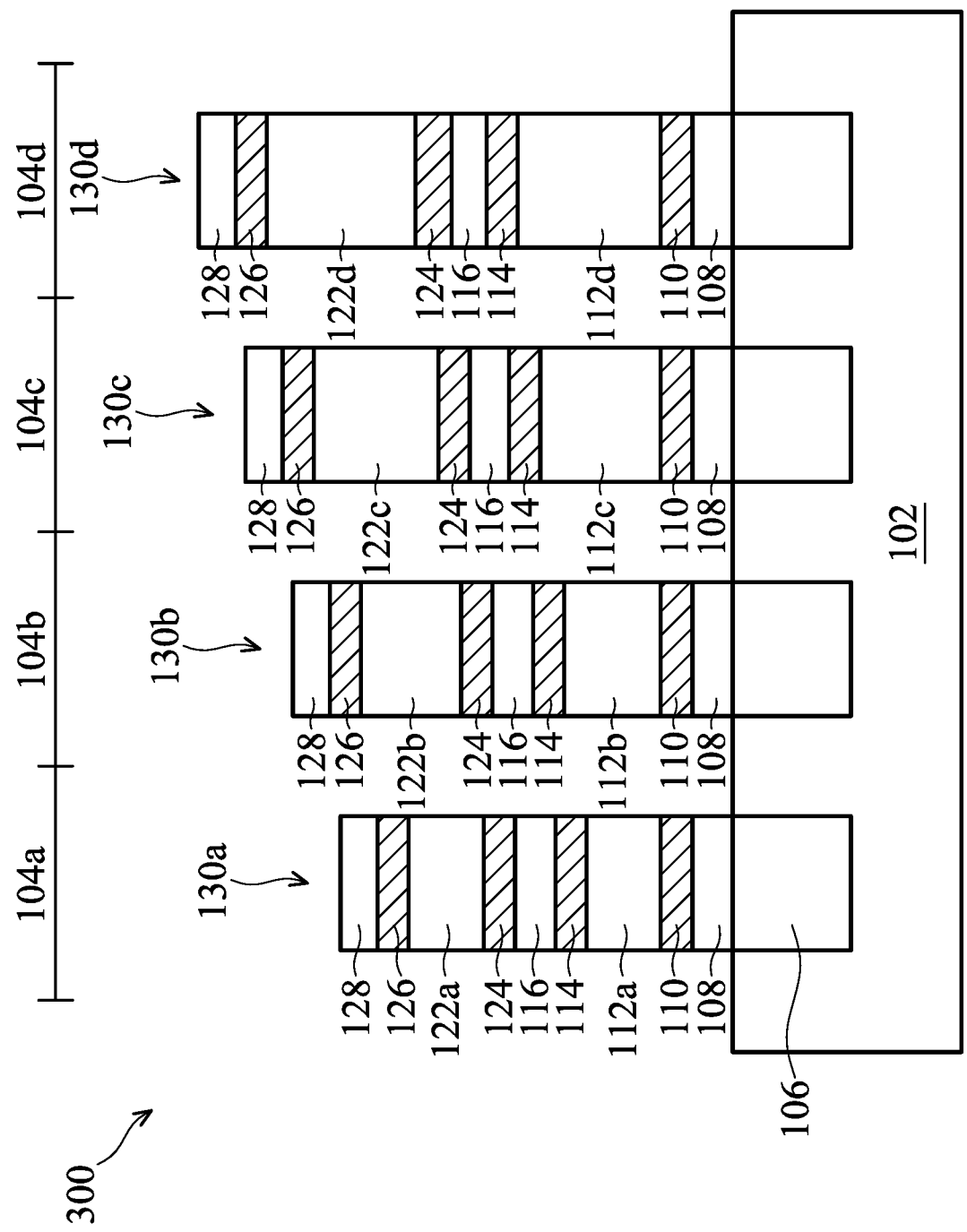
FIG. 3 is a cross-sectional view of an image sensor, in accordance with some embodiments.

Many variations and/or modifications can be made to embodiments of the disclosure. In some embodiments, the waveguide includes two or more MIM structures. Referring to FIG. 3, FIG. 3 is a cross-sectional view of an image sensor 300, in accordance with some embodiments.

In some embodiments, each of the waveguide 130a, the waveguide 130b, the waveguide 130c and the waveguide 130d further include an additional MIM structure. For example, as shown in FIG. 3, the waveguide 130a includes an additional MIM structure composed of a metal layer 124, an insulating layer 122a and a metal layer 126. Further, each of the waveguide 130a, 130b, 130c and 130d includes an additional protective layer 128 over the additional MIM structure. The materials of the additional insulating layer, the additional protective layer and the additional metal layer may be the same as or similar to those of the insulating layer 112, the protective layer 116 and the metal layers 114 respectively, and are not repeated herein.

In some embodiments, as shown in FIG. 3, the thicknesses of two insulating layers in the same waveguide are the same. For example, the thicknesses of the insulating layers 112a, 112b, 112c and 112d are the same as the thicknesses of the insulating layers 122a, 122b, 122c and 122d, respectively. Many variations and/or modifications can be made to embodiments of the disclosure. In some embodiments, the thicknesses of two insulating layers in the same waveguide are different. For example, the thickness of the insulating layer 122a is different from that of the insulating layer 112a. By adjusting the amount of the MIM structure, the light with smaller band of wavelength can be selected to pass through the waveguide.

Figure 4:
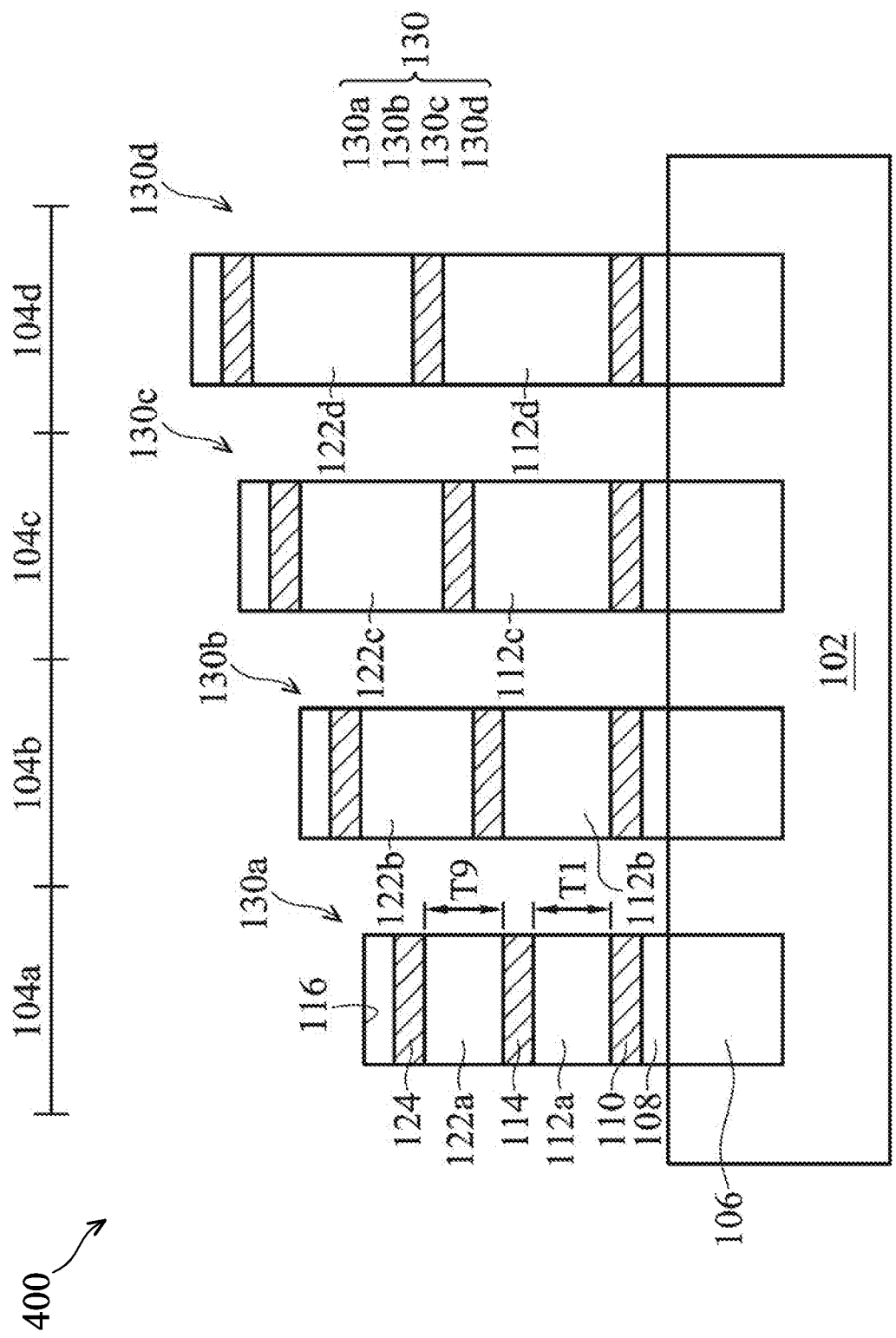
FIG. 4 is a cross-sectional view of an image sensor, in accordance with some embodiments.

Many variations and/or modifications can be made to embodiments of the disclosure. In some embodiments, two MIM structures use a common metal layer. Referring to FIG. 4, FIG. 4 is a cross-sectional view of an image sensor 400, in accordance with some embodiments. As shown in FIG. 4, for example, the waveguide 130a includes the MIM structure composed of the metal layer 110, the insulating layer 112a and the metal layer 114. In addition, the waveguide 130a includes an additional MIM structure composed of the metal layer 114, the insulating layer 122a and the metal layer 124 where the metal layer 114 is used as a bottom metal layer of the additional MIM structure, and the metal layer 124 is also used as a top metal layer of the lower MIM structure. In this embodiment, the metal layer 114 is used as the common metal layer of two MIM structures. In some embodiment, the thicknesses of two insulating layers in the same waveguide are the same. For example, the thickness T9 of the insulating layer 122a is the same as the thickness T1 of the insulating layer 112a. In some embodiments, the thickness T9 of the insulating layer 122a is different from the thickness T1 of the insulating layer 112a.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
    a substrate having a first pixel region and a second pixel region; and
    a resonator structure disposed over the substrate, and the resonator structure comprises:
        a first metal layer disposed over the first pixel region and the second pixel region;
        a first insulating layer disposed over the first metal layer and the first pixel region;
        a second insulating layer disposed over first metal layer and the second pixel region;
        a second metal layer disposed over the first insulating layer and the second insulating layer,
        a first protective layer disposed over the second metal layer over the first pixel region and the second pixel region;
        a third metal layer disposed over the first protective layer over the first pixel region and the second pixel region;
        a third insulating layer disposed over the third metal layer over the first pixel region;
        a fourth insulating layer disposed over the third metal layer over the second pixel region; and
        a fourth metal layer disposed over the third insulating layer and the fourth insulating layer, wherein
    the first metal layer, the first insulating layer, the second metal layer, the first protective layer, the third metal layer, the third insulating layer and the fourth metal layer disposed over the first pixel region form a first waveguide,
    the first metal layer, the second insulating layer, and the second metal layer, the first protective layer, the third metal layer, the fourth insulating layer and the fourth metal layer disposed over the second pixel region form a second waveguide,
    the first waveguide and the second waveguide are disposed with a space therebetween,
    the first wave guide and the second waveguide have a planar topmost surface,
    a height of the second waveguide from the substrate to the topmost surface of the second waveguide is greater than a height of the first waveguide from the substrate to the topmost surface of the first waveguide,
    the first insulating layer and the third insulating layer have a first thickness, and
    the second insulating layer and the fourth insulating layer have a second thickness that is greater than the first thickness.

2. The image sensor as claimed in claim 1, wherein the substrate further comprises a third pixel region, and the second pixel region is located between the first pixel region and the third pixel region, and the resonator structure further comprises a fifth insulating layer disposed over the first metal layer and a sixth insulating layer disposed over the third metal layer over the third pixel region of the substrate, the second metal layer is also disposed over the fifth insulating layer, the third metal layer is disposed over the sixth insulating layer, the fifth insulating layer and the sixth insulating layer have a third thickness that is greater than the second thickness,
    the first metal layer, the fifth insulating layer, the second metal layer, the first protective layer, the third metal layer, the sixth insulating layer, and the fourth metal layer disposed over the third pixel region form a third waveguide, and the second waveguide and the third waveguide are disposed with a space therebetween.

3. The image sensor as claimed in claim 1, further comprising:
a second protective layer disposed between the substrate and the first metal layer.

4. The image sensor as claimed in claim 1, wherein the first insulating layer, the second insulating layer, the third insulating layer and the fourth insulating layer comprise a photosensitive material or a dielectric material.

5. The image sensor as claimed in claim 1, wherein the first insulating layer, the second insulating layer, the third insulating layer and the fourth insulating layer are made of a positive photoresist.

6. The image sensor as claimed in claim 1, wherein the first metal layer and the second metal layer comprise Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, an alloy or a combination thereof.

7. The image sensor as claimed in claim 3, wherein the first protective layer and the second protective layer comprise $SiO_2$ or $Al_2O_3$.

8. A method for forming an image sensor, comprising: providing a substrate having a first pixel region and a second pixel region; and forming a resonator structure over the substrate, and the formation of the resonator structure comprises: forming a first metal layer over the first pixel region and the second region; forming a first insulating layer over the first metal layer, and over the first pixel region, wherein the first insulating layer has a first thickness; forming a second insulating layer over the first metal layer, and over the second pixel region, wherein the second insulating layer has a second thickness that is greater than the first thickness; forming a second metal layer over the first insulating layer and the second insulating layer; forming a first protective layer over the second metal layer over the first pixel region and the second pixel region; forming a third metal layer over the second metal layer over the first pixel region and the second pixel region; forming a third insulating layer over the third metal layer, and over the first pixel region, wherein the third insulating layer has the first thickness: forming a fourth insulating layer over the third metal layer, and over the second pixel region, wherein the second insulating layer has the second thickness that is greater than the first thickness; forming a fourth metal layer over the third insulating layer and the fourth insulating layer, wherein the first metal layer, the first insulating layer, the second metal layer, the first protective layer, the third metal layer, the third insulating layer and the fourth metal layer disposed over the first pixel region form a first waveguide, the first metal layer, the second insulating layer, the second metal layer, the first protective layer, the third metal layer, the fourth insulating layer and the fourth metal layer disposed over the second pixel region form a second waveguide, the first waveguide and the second waveguide are disposed with a space therebetween, wherein the first wave guide and the second waveguide have a planar topmost surface, a height of the second waveguide from the substrate to the topmost surface of the second waveguide is greater than a height of the first waveguide from the substrate to the topmost surface of the first waveguide.

9. The method as claimed in claim 8, wherein the substrate further comprises a third pixel region, and the second pixel region is located between the first pixel region and the third pixel region, and the formation of the resonator structure further comprises:
forming a fifth insulating layer over the first metal layer, and over the third pixel region;
forming a sixth insulating layer disposed over the third metal layer over the third pixel region,
the fifth insulating layer and the sixth insulating layer have a third thickness that is greater than the second thickness,
the first metal layer, the fifth insulating layer, the second metal layer, the first protective layer, the third metal layer, the sixth insulating layer, and the fourth metal layer disposed over the third pixel region form a third waveguide, and the second waveguide and the third waveguide are disposed with a space therebetween.

10. The method as claimed in claim 8, wherein the formation of the first insulating layer and the second insulating layer comprises:
forming a photosensitive material layer over first pixel region and the second pixel region; and
exposing the photosensitive material layer by using a multi-tone mask to form the first insulating layer and the second insulating layer such that the first insulating layer has the first thickness and the second insulating layer has the second thickness.

11. The method as claimed in claim 10, wherein the photosensitive material layer is made of a positive photoresist so that the first thickness of the first insulating layer is smaller than the second thickness of the second insulating layer.

12. The method as claimed in claim 8, further comprising:
forming a second protective layer between the substrate and the first metal layer.

13. The method as claimed in claim 8, wherein the formation of the first insulating layer and the second insulating layer comprises:
forming a spacer layer over the first pixel region and the second pixel region of the substrate;
forming a photosensitive material layer over the spacer layer; and
exposing the photosensitive material layer by using a multi-tone mask to form a first etching buffer layer over the first pixel region and a second etching buffer layer over the second pixel region, wherein the first etching buffer layer has a fourth thickness and the second etching buffer layer has a fifth thickness that is greater than the fourth thickness.

14. The method as claimed in claim 13, wherein the formation of the first insulating layer and the second insulating layer comprises:
performing an etching process to remove the first etching buffer layer and the second etching buffer layer, and removing a portion of the spacer layer such that the first insulating layer has the first thickness and the second insulating layer has the second thickness.

15. The method as claimed in claim 14, wherein removing the portion of the spacer layer comprises:
removing a first portion of the spacer layer in the first pixel region; and
removing a second portion of the spacer layer in the second pixel region, wherein the second portion is smaller than the first portion.

16. The method as claimed in claim 13, wherein the photosensitive material layer is made of a positive photoresist.

17. The method as claimed in claim 13, wherein the spacer layer comprises an insulating material.

\* \* \* \* \*